United States Patent
Hsu et al.

(10) Patent No.: US 7,919,338 B2
(45) Date of Patent: Apr. 5, 2011

(54) METHOD OF MAKING AN INTEGRALLY GATED CARBON NANOTUBE FIELD IONIZER DEVICE

(76) Inventors: David S. Y. Hsu, Alexandria, VA (US); Jonathan L Shaw, Springfield, CA (US)

( * ) Notice: Subject to any disclaimer, the term of this patent is extended or adjusted under 35 U.S.C. 154(b) by 45 days.

(21) Appl. No.: 12/420,160

(22) Filed: Apr. 8, 2009

(65) Prior Publication Data

US 2009/0224225 A1 Sep. 10, 2009

Related U.S. Application Data

(62) Division of application No. 11/452,567, filed on Jun. 9, 2006, now Pat. No. 7,535,014.

(51) Int. Cl.
H01L 21/00 (2006.01)
H01L 21/3205 (2006.01)
H01L 21/4763 (2006.01)

(52) U.S. Cl. ............ 438/22; 438/589; 438/595; 438/48

(58) Field of Classification Search .................... 438/22, 438/48, 775, 776, 777, 82, 99, 778, 780, 438/589, 591, 585, 584, 598, 595; 977/938, 977/876, 936
See application file for complete search history.

(56) References Cited

U.S. PATENT DOCUMENTS

| | | | | |
|---|---|---|---|---|
| 6,515,325 B1* | 2/2003 | Farnworth et al. | ............ | 257/296 |
| 6,821,911 B1* | 11/2004 | Lo et al. | ........................ | 438/780 |
| 6,830,981 B2* | 12/2004 | Lee et al. | ....................... | 438/309 |
| 6,979,947 B2* | 12/2005 | Yaniv et al. | .................... | 313/495 |
| 7,233,071 B2* | 6/2007 | Furukawa et al. | ............ | 257/759 |
| 2010/0164343 A1* | 7/2010 | Choi et al. | ........................ | 313/1 |

* cited by examiner

*Primary Examiner* — Chuong A. Luu
(74) *Attorney, Agent, or Firm* — Amy Ressing; Stephen T. Hunnius

(57) ABSTRACT

A method of making an integrally gated carbon nanotube field ionization device comprising forming a first insulator layer on a first side of a substrate, depositing a conductive gate layer on the first insulator layer, forming a cavity in the substrate by etching a second side of the substrate to near the first insulator layer, wherein the second side is opposite the first side and wherein a portion of the first insulator is over the cavity, etching an aperture in the portion of the first insulator layer and the conductive gate layer to form an aperture sidewall, depositing a second insulator layer removing the second insulator layer from the top surface, depositing a metallization layer over the second insulator layer, depositing a catalyst layer on the metallization layer and growing a carbon nanotube from the catalyst layer.

19 Claims, 5 Drawing Sheets

METHOD OF MAKING AN INTEGRALLY GATED CARBON NANOTUBE FIELD IONIZER DEVICE

This application is a divisional application of U.S. application Ser. No. 11/452,567 filed on Jun. 9, 2006 now U.S. Pat. No. 7,535,014 the entirety of which is herein incorporated by reference.

The present invention relates to a field ionizer device and more specifically to a carbon nanotube field ionizer device.

Atoms or molecules can become field ionized in the presence of strong electric field in the proximity of a sharp tip biased positive relative to a cathode, yielding positive ions. [R. Gomer, Field emission and field ionization, Harvard Univ. press, 1961, Cambridge, Mass.]. Electrons tunnel from the atom or molecule into the tip, followed by the ejection of the resulting positive ion from the tip region.

The first work on field ionization was performed by Muller in 1953 [E. W. Muller, Ergeb. Exakt. Naturviss. 27, 290 (1953)] who used a sharp single crystal tungsten needle biased positively to thousands of volts. It was observed that closer the molecule is to the tip surface (such as in the adsorbed state), the lower the field required for field ionization and the narrower the ion energy distribution becomes [Gomer]. In addition, the more polarizable the molecule, the higher is the probability of field ionization, due to the longer time the molecule spends in the ionization zone as a result of the attraction. This also applies to molecules in a liquid film state on the tip surface as they spend longer time than a gas in the ionization zone.

A natural application of field ionization is the ion source for mass spectrometry. The unique advantage here is that field ionization produces no internal excitation (vibrational, electronic) which leads to very little breakup of the molecule, whereas the more conventional electron impact ionization causes fragmentation of the parent molecule.

For example, field ionized acetone has just one major mass peak, whereas electron impact ionization produces 18 mass fragment peaks [Gomer]. The "soft" field ionization process vastly simplifies mass spectroscopic analysis, and would be of great value for the detection of large molecules such as proteins and other biological molecules.

In order to increase the ion currents, many field ionizer arrangements commonly using large and dense arrays of sharp needles, whiskers, and even nanorods have been used. These all do not have microfabricated gates and usually require high voltages. High voltages result in high molecular ion energies which is undesirable due to their fragmenting upon impact with the ion collector.

Microfabricated field ionizers with microns-size diameter integrated gates have been previously fabricated to greatly reduce the voltage for field ionization [C. A. Spindt, Surface Science 266, 145 (1992): B. Ghodsian, et al. IEEE Electron Device Letters 19, 241 (1998)]. Spindt's "microvolcano" field ionizer array used a microfabricated hollow, volcano-shaped metal cone through which the gas was injected from the backside. Some aspects of gas injection from the backside and forcing all the gas to flow through the ionizer tip can be found in the prior art. However, the present invention differs dramatically and offers advantages over Spindt's microvolcano ionizer as the carbon nanotubes can be on the sidewalls of the field ionizer apertures, which, due to their extreme sharpness and high aspect ratio, allows for lower voltages. Another aspect of the present invention is that the carbon nanotubes have a larger capacity and higher surface-to-volume ratio for adsorbing gases than the metal film in Spindt's microvolcanos. Field ionization efficiency is greatly enhanced by the higher surface concentration of gases (due to higher adsorption) in the ionization zone. The large surface-to-volume ratio of the nanotubes also facilitates allows liquid analytes to wick up the nanotube into the ionization zone in high molecular concentration of the liquid form.

DETAILED DESCRIPTION

Figure 3:
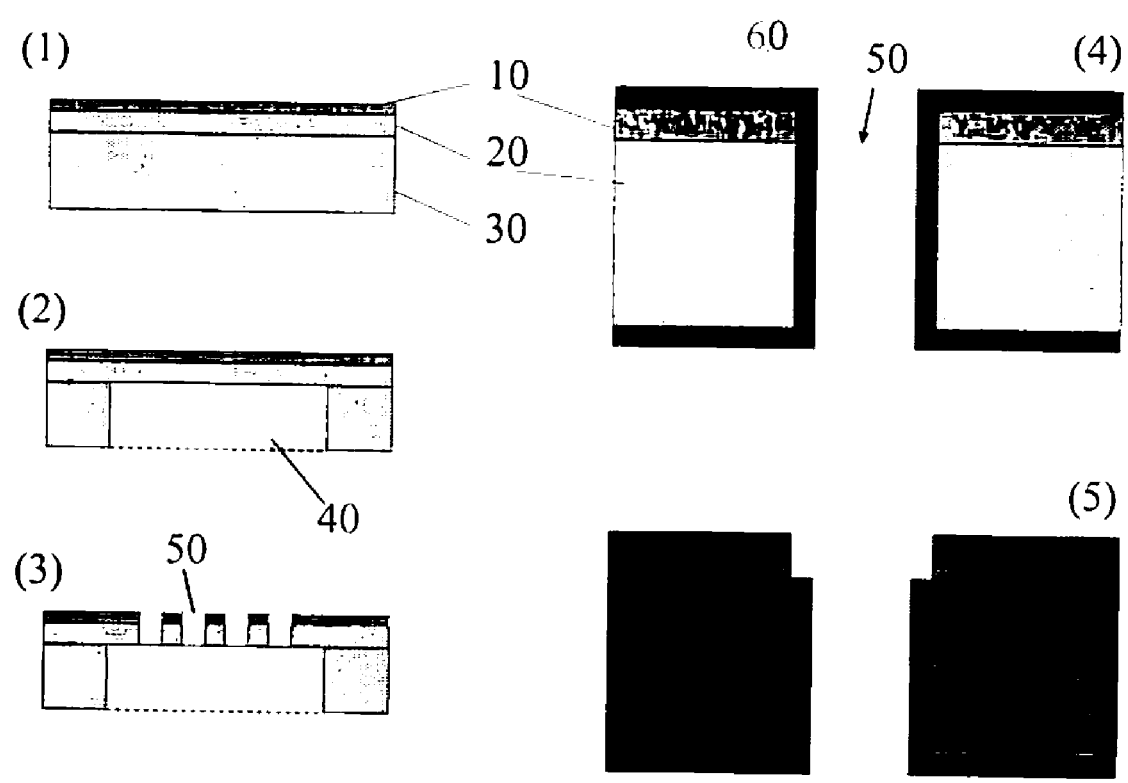
FIG. 3 shows a schematic of five views of a field ionization device.
Figure 4:
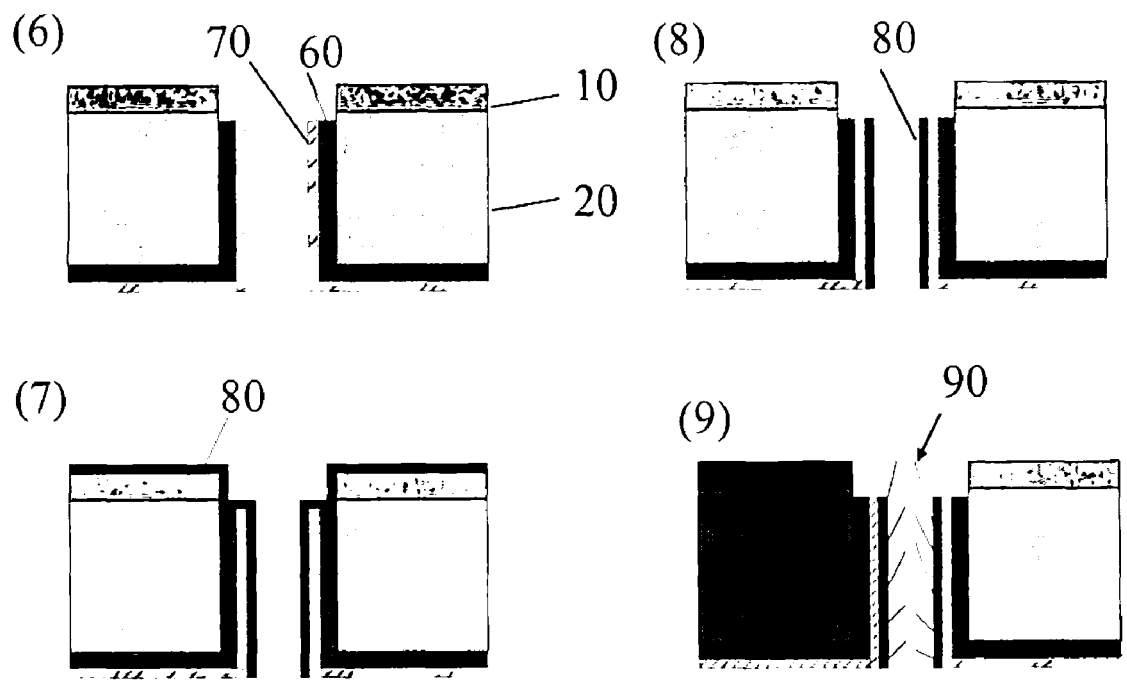
FIG. 4 shows a schematic of four views of a field ionization device.
Figure 5:
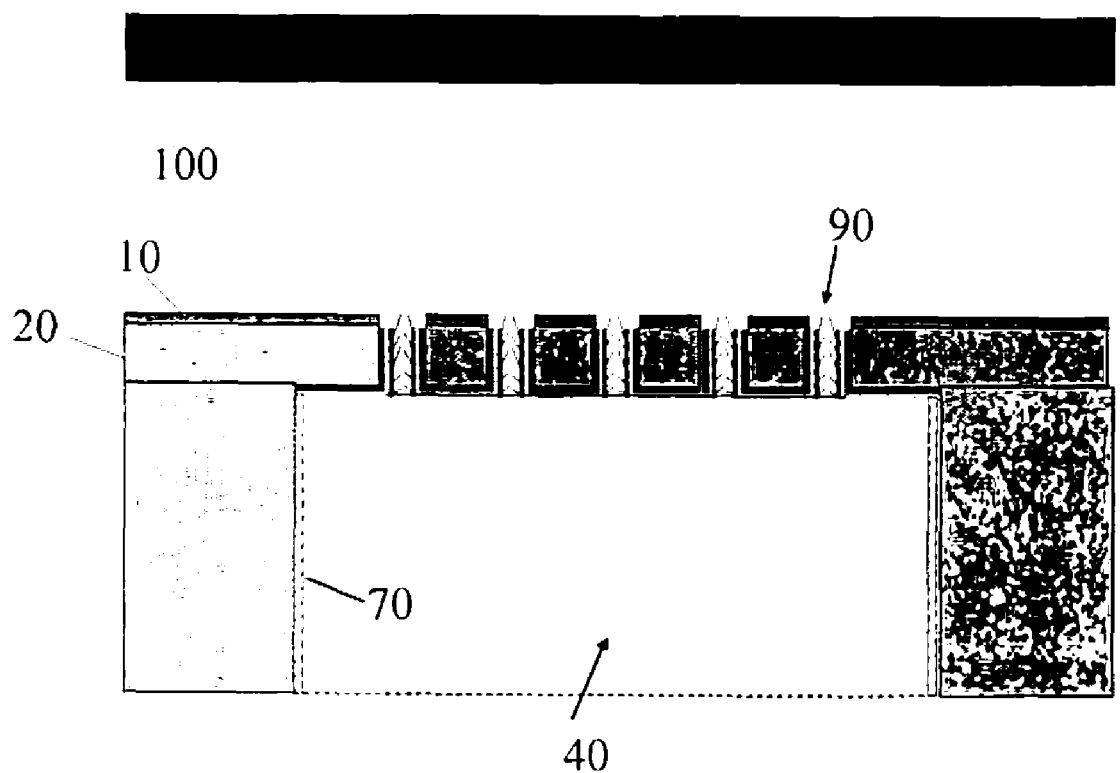
FIG. 5 shows a schematic of one view of a field ionization device.

As in FIGS. 3, 4, and 5, a field ionization device (300) can include a substrate (30) and a gate (10) a first insulator layer (20) positioned between the substrate (30) and the gate (10) with an aperture (50) in the gate (10) and the insulator (20) forming an interior wall. The device further includes a second insulator layer (60) on the interior wall, a metallization layer (70) on the second insulator layer (60), a catalyst layer (80) on the metallization layer (70), and a carbon nanotube (90) on the catalyst layer (80).

The field ionization device (300) can include a collector (100).

The field ionization device (300) can be such wherein the gate (10) is biased negative with respect to the carbon nanotube (90) or wherein the collector (100) is biased more negative than the gate (10).

The field ionization device (300) can further include an electric field between the carbon nanotube (90) and the gate (10).

A gas can have access to the carbon nanotube (90). Or a liquid containing analytes can have access to the carbon nanotube (90).

The substrate (30) of the field ionization device (300) can be a semiconductor or a conductor. The insulator can be a high resistivity material such as silicon dioxide or silicon nitride. The metallization layer (70) can be a conductor with strong adhesion to the second insulator. Examples of the metallization layer (70) can be Cr, Ti, W, Ta, or TiN. The catalyst layer (80) can be Ni, Co, Fe, Pd, alloys thereof, or combinations thereof. The catalyst layer (80) can also serve as the metallization layer (70) on the sidewalls of the second insulator in the aperture.

It will be understood that one embodiment of the field ionization device (300) can include multiple carbon nanotube (90)s.

Furthermore, other embodiments are possible and can include wherein the carbon nanotube (90) is located near the top of the metallization layer (70) or wherein the carbon nanotube (90) is located near the top of the second insulator layer or wherein the carbon nanotube (90) is located on the interior wall.

Yet another embodiment of the field ionization device (300) can include an array of multiple devices as described herein.

Still further, another embodiment of a field ionization device (300) can include a first insulator layer (20) on a first side of a substrate (30), a conductive gate (10) layer on the first insulator layer (20), a cavity in the substrate (30), a portion of first insulator over the cavity, an aperture (50) in the portion of the first insulator layer (20) and the conductive gate (10) layer thereby forming an aperture (50) and aperture (50) sidewall. Additionally, the field ionization device (300) can include a second insulator layer on the aperture (50) sidewall on the first insulator layer (20) and surface of the cavity, a metallization layer (70) over the second insulator layer on the aperture (50) sidewall and on surface of the cavity, a catalyst layer (80) on the metallization layer (70) on the second insulator on the aperture (50) sidewall, and a carbon nanotube (90) on the catalyst layer (80) on the metallization layer (70) on the second insulator on the aperture (50) sidewall.

The cavity can be made by etching a second side of the substrate (30) to near the insulator layer, wherein the second side is opposite the first side. The carbon nanotube (90) can be grown from the catalyst layer (80) on the metallization layer (70) on the second insulator layer (60) on the aperture (50) sidewall. The catalyst layer (80) can serve as the metallization layer (70) on the sidewalls on the second insulator layer (60) in the aperture (50). The catalyst layer (80) can be on the second insulator layer (60) in the aperture (50) and thus no metallization layer (70) may be needed. With one embodiment, it can be preferable to have only catalyst in the aperture (50).

The device can further include a collector (100) located near the carbon nanotube (90). The conductive gate (10) layer can be biased negative with respect to the carbon nanotube (90). The collector (100) can be biased more negative than the conductive gate (10) layer. An electric field can exist between the carbon nanotube (90) and the conductive gate (10) layer.

The substrate can be a semiconductor or a conductor. The insulator can be a high resistivity material such as silicon dioxide or silicon nitride. The metallization layer can be a conductor with strong adhesion to the second insulator. The metallization layer can be selected from the group consisting of Cr, Ti, W, Ta, and TiN.

The catalyst layer can be selected from the group consisting of Ni, Co, Fe, Pd, alloys thereof, and combinations thereof. Furthermore, the device can include multiple carbon nanotubes.

A gas can flow through the aperture (50) in the substrate (30), the first insulator layer (20), the second insulator, the metallization layer (70), and the conductive gate (10) layer. Or a liquid containing analytes can flow through the aperture (50) in the substrate (30), the first insulator layer (20), second insulator layer (60), the metallization layer (70), and the conductive gate (10) layer. A gas can have access to the carbon nanotube. Or a liquid containing analytes can have access to the carbon nanotube.

The catalyst layer can reside on the metallization layer only in said aperture. The device can have the metallization layer in the aperture as the catalyst layer.

Another embodiment can include an array of multiple devices as described herein.

A method of making a field ionization device (300) can include forming a first insulator layer (20) on a first side of a substrate (30), depositing a conductive gate (10) layer on the first insulator layer (20), forming a cavity in the substrate (30) by etching a second side of the substrate (30) to near the first insulator layer (20), wherein the second side is opposite the first side and wherein a portion of the first insulator is over the cavity, etching an aperture (50) in the portion of the first insulator layer (20) and the conductive gate (10) layer to form an aperture (50) and aperture (50) sidewall, depositing a second insulator layer (60) on the substrate (30) and the first insulator layer (20) and the aperture (50) sidewall and the conductive gate (10) layer, removing the second insulator layer (60) from the top surface, depositing a metallization layer (70) over the second insulator layer (60) on the aperture (50) sidewall and on surface of the cavity, depositing a catalyst layer (80) on the metallization layer (70) on the second insulator on the aperture (50) sidewall, and growing a carbon nanotube (90) from the catalyst on the metallization layer (70) on the second insulator layer (60) on the aperture (50) sidewall.

Furthermore the method can include patterning that can be done by lithography.

Still furthermore, the method can include locating a collector (100) near the top surface.

The electric field strength required for field ionization can be several times higher than the reverse field required for field emission, which can push the limits of dielectric breakdown for insulator materials used in the microgated device. This is where extremely sharp and high aspect ratio structures can have an advantage in reducing the voltage required to achieve the required field strength.

Carbon nanotubes (CNTs) have extremely small diameters (small nanometers) and high aspect ratios. In the recent years, they have been extensively studied as field electron emitters and have become premier candidates on account of their natural geometry and superior electronic and material properties. The overwhelming majority of the studies used a diode configuration in which an electrode (anode) placed near a grounded CNT-populated substrate is biased positive.

The bias voltages are in general hundreds of volts on account of the macroscopic anode-CNT separation. A few groups, including this laboratory, have managed to microgate the CNTs by growing CNTs directly into microgated structures. Electron emission is induced by applying a positive voltage on the gate electrode and collected on an anode (in a triode structure). Because the microgates are much closer to the CNTs (~micron), the required bias voltage (on the gate electrode) becomes much lower than in the diode configuration.

Because of the nanotubes and the microgating the high electric field required can be achieved more easily than with other materials.

Figure 1:
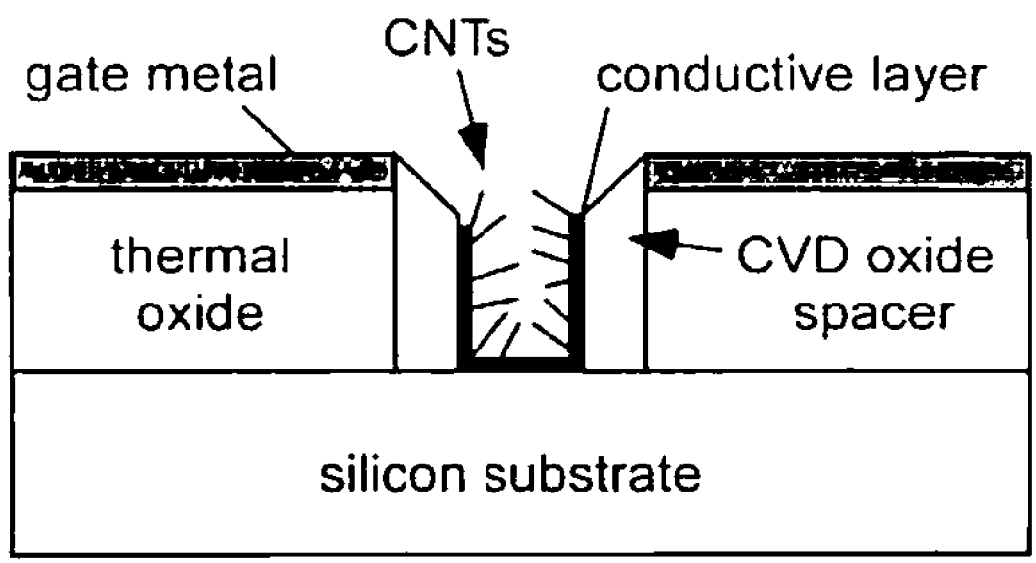
FIG. 1 shows a schematic and a scanning electron micrograph of one configuration of a gated CNT field emitter cell developed at NRL.
Figure 1:
Figure 2:
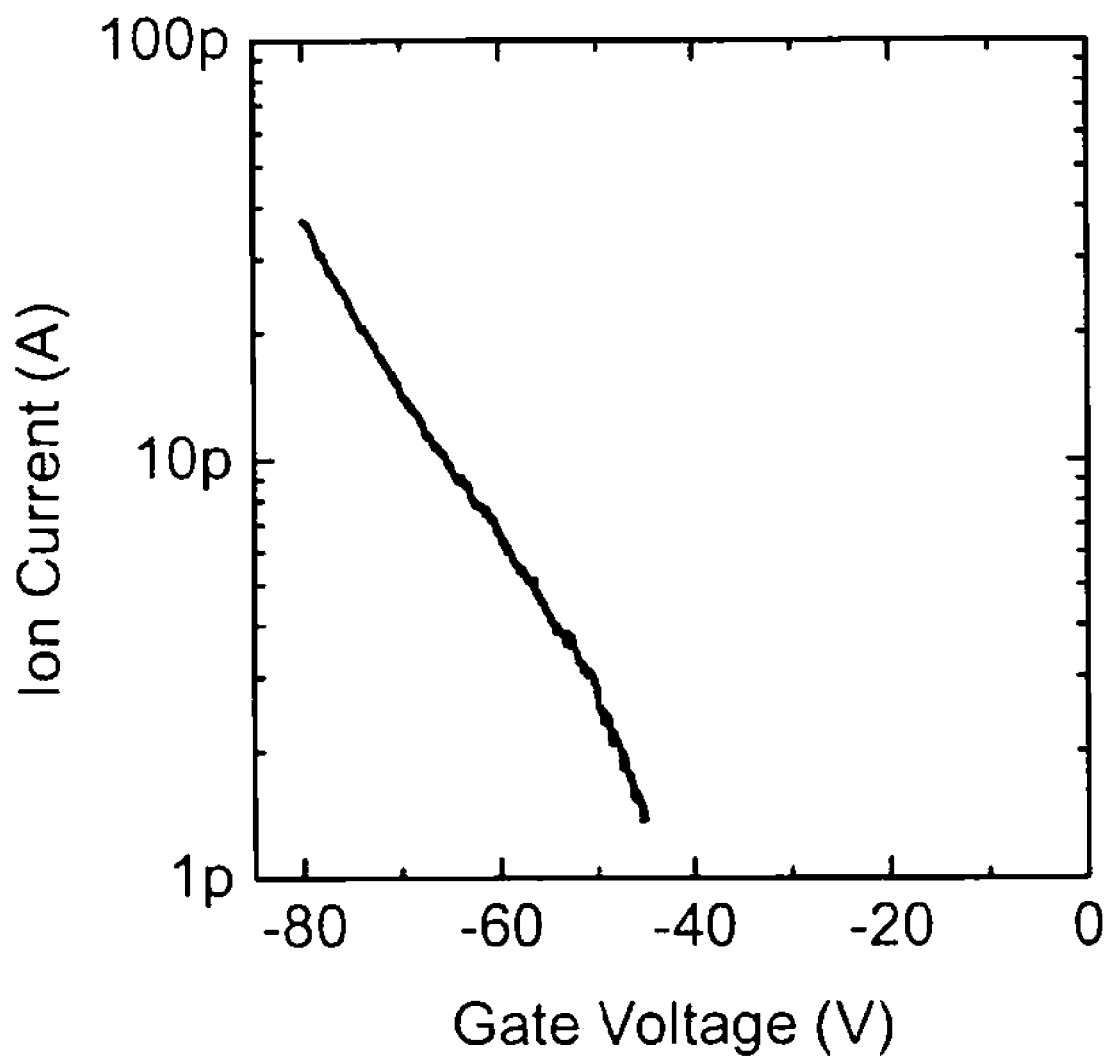
FIG. 2 shows the graph of ion current as a function of gate voltage for the field ionization of hydrogen.

Here, a carbon nanotube field ionizer has been demonstrated. A different configuration was used in which the carbon nanotubes were grown on gated silicon posts. By negatively biasing the gate in the presence of $10^{-4}$ Torr hydrogen, hydrogen has been field ionized and an ion current ($H_2^+/H^+$) as a function of gate voltage has been obtained as shown in FIG. 2.

The field ionizer device (300) can consist of an array of gated small through-apertures (50) in an insulator supported over a larger aperture (40) on a substrate (30) with carbon nanotubes (90) (CNTs) projecting from the aperture (50) sidewalls, as shown in FIG. 5. Each such small aperture (50) can be designated as a "field ionization cell." The CNTs can be in electrical contact with the substrate (30) and can be electrically insulated from the gate (10). During operation, the gate (10) can be biased negative with respect to the CNTs/substrate, and the collector (100) can be biased more negative than the gate (10). A strong electric field can be formed between the top CNTs and the gate (10). The gas can flow from the bottom larger aperture (40) in the substrate (30) through the field ionization cells and the molecules in contact with the tip surfaces of the nanotubes (where the field is the strongest) can become ionized when sufficient voltage/field is applied. The positive ions can then be accelerated toward the collector (100) plate.

The fabrication process can start with depositing or growing an insulator layer (20) on a substrate (30), followed by the deposition of a conductive gate (10) layer, as shown in FIG. 3. Next, the backside of the substrate (30) can be etched through, until it stops at (or near) the insulator layer, forming a cavity (40). (FIG. 3). A conformal layer of insulator material 60 such as silicon dioxide can be deposited on the substrate (30), such as by using low pressure chemical vapor deposition (LPCVD) (FIG. 3). Then directional dry etching from the top or glancing angle sputtering can be used to remove the insulator layer (60) from only the top horizontal surfaces (FIG. 3). A metallization layer (70) can be deposited from the backside of the substrate (30) over the insulator layer (60) on the sidewalls of the apertures (50) and over the surfaces of the cavity (40) (FIG. 4). Next, a catalyst layer (80) can be deposited from the top side of the sample to coat the resulting insulator layer (60) sidewalls in aperture (50) and the top surface (FIG. 4). Glancing angle sputtering can be used to remove the catalyst layer (80) from the top horizontal surface (FIG. 4). Carbon nanotubes (90) can then be grown using CVD from the catalyst on the sidewall of the apertures (50), forming a "field ionizer cell" (FIG. 4). FIG. 5 shows an example device including an array of ionizer cells and an ion collector (100) plate.

The carbon nanotubes can be the field ionizer tip. Their extremely high aspect ratio and sharpness can produce higher local field strengths than most other materials at a given voltage in a microgated cell. Field ionization requires higher field strengths than field emission which means dielectric breakdown in the insulator can be a serious potential problem. The use of CNTs can overcome this problem by not requiring as high voltages to achieve the fields required for field ionization.

Carbon nanotubes have a larger capacity (also larger surface-to volume ratio) for adsorbing molecules on the surface and within the tube. The cross-section for field ionization can be greatly improved if the molecule starts in an adsorbed state on the tip.

The present design provides for 100% of the gases to have to pass through the ionizer cells which maximizes the fraction of molecules to be ionized.

The present design provides for a device wherein liquids with high vapor pressures can be used. Because the apertures can be small, liquid analytes in the cavity can wick up the small ionizer cell apertures and nanotubes and have an enhanced cross-section for field ionization.

Another embodiment for a field ionizer can be a device structure without the backside cavity, i.e. just the array of ionizer cells whose bottoms terminate in the solid substrate. The gas molecules can impinge on the nanotubes from the top aperture openings and can be less efficient. In fact field ionization results can be obtained by using another of the present CNT arrays (which have CNTs grown on gated silicon posts, as described in Hsu and Shaw, Appl. Phys. Lett., 80, 118 (2002), herein incorporated by reference. FIG. 2 shows example field ionization results.

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g., using the articles "a," "an," "the," or "the" is not construed as limiting the element to the singular.

What we claim is:

1. A method of making an integrally gated carbon nanotube field ionization device comprising:

forming a first insulator layer on a first side of a substrate;

depositing a conductive gate layer on said first insulator layer;

forming a cavity in said substrate by etching a second side of said substrate to near said first insulator layer, wherein said second side is opposite said first side and wherein a portion of said first insulator is over said cavity;

etching an aperture in said portion of said first insulator layer and said conductive gate layer to form an aperture sidewall;

depositing a second insulator layer on said substrate and said first insulator layer and said aperture sidewall and said conductive gate layer;

removing said second insulator layer from the top surface;

depositing a metallization layer over said second insulator layer;

depositing a catalyst layer on said metallization layer; and growing a carbon nanotube from said catalyst layer.

2. The method of claim 1 wherein said patterning is by lithography.

3. The method of claim 1 further including additional electrodes used to direct, accelerate, or collect the ions.

4. The method of claim 1 wherein the carbon nanotube on said catalyst layer is in electrical contact with the substrate and electrically insulated from the gate.

5. The method of claim 4 further including biasing the gate negative with respect to the carbon nanotube and substrate.

6. The method of claim 5 further including biasing a collector more negative than the gate.

7. The method of claim 5 further including channeling an analyte from the backside via the cavity and through to contact the carbon nanotube where the analyte is field ionized.

8. The method of claim 1 further including channeling a gas to said carbon nanotube via channeling through the cavity from the backside and field ionizing.

9. The method of claim 1 further including channeling a liquid containing analytes to said carbon nanotube via channeling through the cavity from the backside and field ionized.

10. The method of claim 9 wherein said substrate is a semiconductor or a conductor.

11. The method of claim 1 wherein said insulator is a high resistivity material such as silicon dioxide or silicon nitride.

12. The method of claim 11 wherein said metallization layer is a conductor with strong adhesion to said second insulator and is selected from the group consisting of Cr, Ti, W, Ta, and TiN and said catalyst layer is selected from the group consisting of Ni. Co, Fe, Pd, alloys thereof, and combinations thereof.

13. The method of claim 1 further comprising multiple carbon nanotubes.

14. The method of claim 1 wherein said carbon nanotube is located on said interior wall.

15. The method of claim 1 wherein said catalyst layer resides on said metallization layer only in said aperture.

16. The method of claim 1 wherein said metallization layer in said aperture is the catalyst layer.

17. The method of claim 1 wherein said carbon nanotube is grown from said catalyst layer on said metallization layer on said second insulator layer on said aperture sidewall.

18. The method of claim 1 wherein said metallization layer on said sidewall of said second insulator on said aperture sidewall is the catalyst layer and further including an electric field between said carbon nanotube and said conductive gate layer.

19. The method of claim 1 further including flowing a gas or liquid containing analytes through said aperture in said substrate and in said first insulator layer, said second insulator layer, said metallization layer and said conductive gate layer.

* * * * *